United States Patent [19]
Mirow

[11] Patent Number: 5,241,286
[45] Date of Patent: Aug. 31, 1993

[54] FET OSCILLATOR USING VOLTAGE AND TEMPERATURE COMPENSATED AMPLIFIER

[76] Inventor: Fred Mirow, 2725 W. Country Club Rd., Philadelphia, Pa. 19131

[21] Appl. No.: 952,194

[22] Filed: Sep. 28, 1992

Related U.S. Application Data

[63] Continuation of Ser. No. 751,122, Aug. 28, 1991, abandoned.

[51] Int. Cl.⁵ .......................... H03B 5/04; H03B 5/20; H03B 5/24
[52] U.S. Cl. ............................... 331/108 B; 331/135; 331/176
[58] Field of Search ......... 331/108 B, 116 R, 116 FE, 331/117 R, 117 FE, 135, 176, 177 V, 136, 137

[56] References Cited

U.S. PATENT DOCUMENTS

| | | | |
|---|---|---|---|
| 3,246,258 | 4/1966 | Boreen | 331/177 R |
| 4,343,219 | 8/1982 | Vetrecht | 331/177 R X |
| 4,851,792 | 7/1989 | Ochiai et al. | 331/176 |
| 5,072,197 | 12/1991 | Anderson | 331/57 |
| 5,075,643 | 12/1991 | Einbinder | 331/185 X |
| 5,097,228 | 3/1992 | McJunkin | 331/185 X |

*Primary Examiner*—David Mis

[57] ABSTRACT

A FET oscillator with increased frequency stability. This is accomplished by using a controlled voltage supply to power the amplifier stage of the oscillator. This voltage changes as the FET amplifier temperature increases in order to reduce the variation in frequency, caused by the amplifier's gain and phase shift changes. By using this compensated amplifier as the active section of an oscillator, the oscillator frequency stability is increased.

9 Claims, 2 Drawing Sheets

FET OSCILLATOR USING VOLTAGE AND TEMPERATURE COMPENSATED AMPLIFIER

This is a continuation of copending application Ser. No. 07/751,122, filed on Aug. 28, 1991, now abandoned.

BACKGROUND ART

This invention relates to FET oscillators in which the oscillation frequency is relatively independent of supply voltage and ambient temperature. The term FET is used to refer to CMOS, MOSFET, JFET and other variation of the Field Effect Transistor.

One of the problems associated with FET oscillators at high frequency is that the oscillation frequency is very sensitive to changes in ambient temperature and power supply voltage. To reduce this instability some form of compensation is necessary. One of the methods used is to use a FET as a resistor to control the charging time of a capacitor. The FET resistance value is controlled by a temperature dependent voltage which varies to maintain a constant capacitor charging time. This is described in U.S. Pat No. 4,547,749 issued to Clinton Kuo. Another method is to use a constant current source circuit, which is designed to be temperature independent, to charge and discharge a timing capacitor. This is described in U.S. Pat No. 4,714,901 issued to Jain et al.

In these methods the variation in oscillator frequency has been reduced by controlling the charging time of capacitors, but nothing has been done to correct an other large error source, the high sensitivity of the FET amplifier to temperature and supply voltage change.

SUMMARY OF THE INVENTION

The object of this invention is a FET oscillator in which the frequency stability is increased by reducing the change in the amplifier circuit gain and phase shift due to variations in ambient temperature and power supply voltage. This reduction is accomplished by powering the amplifier from a power supply in which the output voltage level varies with temperature.

An oscillator can be described by dividing it into two sections, the amplifier and feedback network. The amplifier provides the necessary level of gain at the operating frequency. Ideally the amplifier has stable gain and phase shift, or in the time domain propagation delay time. The feedback network selects the frequency at which oscillation will occur by providing at the operating frequency the proper value of phase shift for oscillation to occur. The feedback network phase shift should also be constant against voltage and temperature variations. In oscillators using high quality passive components (capacitors, resistors, etc.) in the feedback network, the FET amplifier section has the greater parameter variation with supply voltage and temperature. The FET parameter changes cause the amplifier gain and phase shift to change which in turn changes the frequency of oscillation. In an oscillator that uses inductor or quartz crystal elements, the selectivity or Q of the feedback network is high enough that the amplifier variations have little effect on the frequency of oscillation. However, there are many oscillators with low selectivity feedback networks in which the amplifier variation has significant effect, such as the resistor capacitor ladder phase shift feedback network oscillators. Integrated circuits can incorporate high quality thin film resistors and MOS capacitors that are stable with voltage and temperature, however the FET amplifier section is not stable. The invention being described here is the most beneficial in oscillators with low values of selectivity in their feedback network, but can also improve all oscillators.

Using this approach a variable frequency oscillator can also be constructed by using a controlled voltage supply to power the oscillator's amplifier. The voltage supply's output voltage level changes in response to temperature and also in response to an additional frequency control input signal.

BRIEF DESCRIPTION OF THE DRAWINGS

The invention will be described in detail hereinafter with reference to the accompanying drawings; in which.

DETAILED DESCRIPTION OF THE INVENTION

Figure 1:
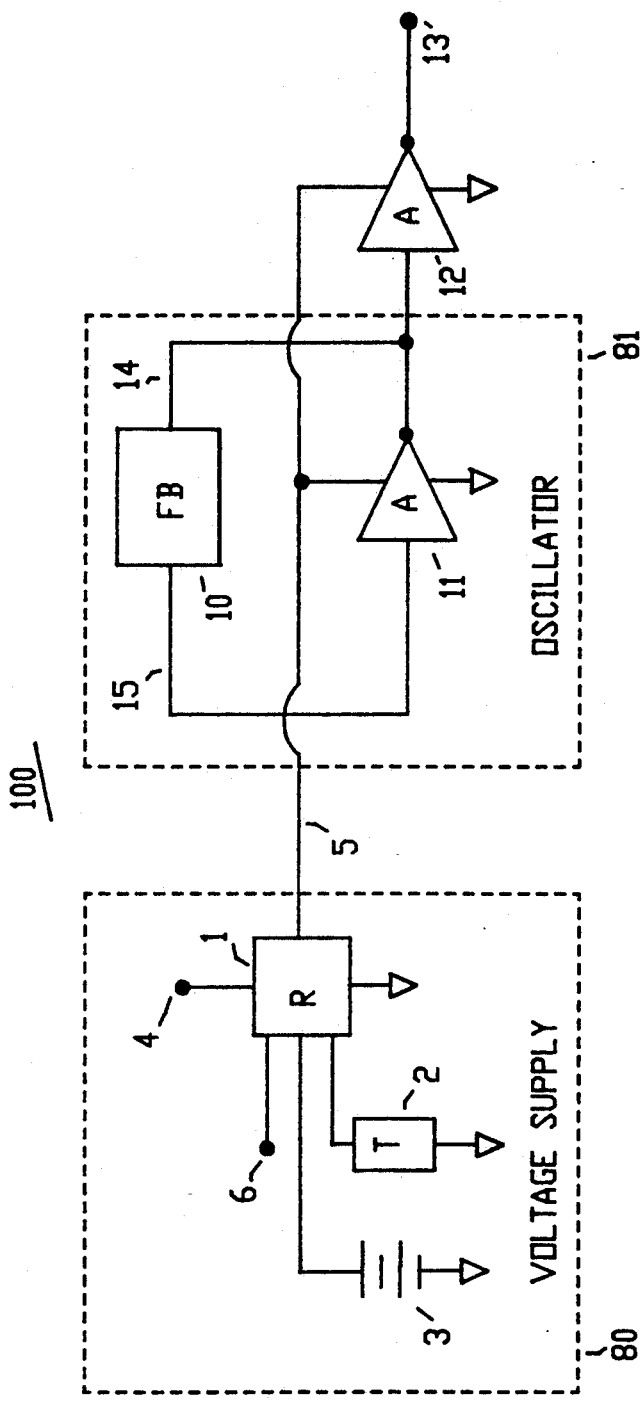
FIG. 1 is a schematic representation of the circuit of the present invention.

Shown in FIG. 1 is compensated oscillator 100 comprising oscillator 81, buffer amplifier 12, and voltage supply 80. The oscillator 81 consist of feedback network 10 and amplifier 11. Feedback network 10 is connected to the input and output of amplifier 11 by lines 14 and 15. Amplifier 11 has a phase shift of about 180 degrees and feedback network 10 supplies the remaining phase shift necessary to make the total phase shift at the frequency of oscillation 360 degrees. If amplifier 11 is not an invertor, than the feedback network 10 will provide the required phase shift amount to have 360 degrees total. The phase shift provided by feedback network 10 varies with frequency but is relatively stable against any other variations such as temperature and voltage. There are many well known phase shift networks that can be used such as the twin T and the Wien bridge. Amplifier 11 phase shift and gain are effected by the voltage on line 5 and ambient temperature. Line 5 supplies the voltage to power the amplifier from voltage supply 80. The effect of temperature is that as the temperature increases the phase shift of amplifier 11 changes causing the frequency of oscillation to change. The effect of temperature on amplifier 11 is substantially canceled by changing the voltage on line 5. Thus the voltage on line 5 serves as a frequency control signal to adjust the output frequency of oscillator 81.

Voltage supply 80 consist of voltage regulator 1, voltage reference 3, and temperature sensor 2. Voltage regulator 1 receives unregulated DC voltage at terminal 4. The two input signals to voltage regulator 1 are voltage reference 3 and temperature sensor 2. Voltage regulator 1 output on line 5 is a DC voltage that is nominally set by voltage reference 3 and varies only in a controlled manner with the temperature change of temperature sensor 2 which is thermally coupled to amplifier 11. Voltage regulator 1 may use an operational amplifier or an other well known voltage regulator circuit. Temperature sensor 2 can be a diode or a temperature sensitive resistor. The ratio of line 5 voltage change to temperature change is a set value determined by voltage supply 80 circuit values. As the temperature of amplifier 11 varies the output signal of temperature sensor 2 causes the voltage on line 5 to vary in a direction to maintain the oscillation frequency nearly constant. Thus, voltage variations on line 5 compensate for frequency variations caused by changes in temperature.

Buffer amplifier 12 provides isolation between the output terminal 13 and the signal on line 14. It may be overdriven to provide a square wave output signal. The voltage to power this amplifier may come from terminal 4 instead of line 5.

Figure 2:
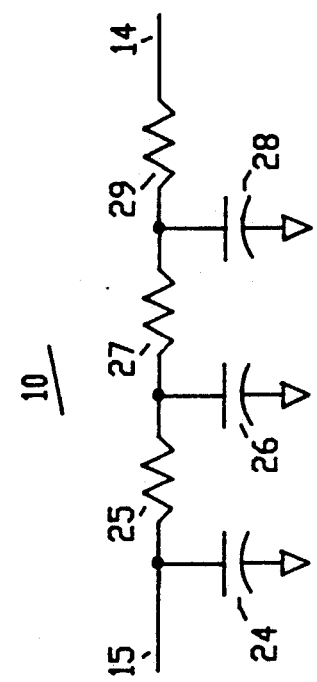
FIG. 2 is a schematic representation of Feedback network 10.

Referring now to FIG. 2, a practical means of implementing feedback network 10 to provide 180 degrees phase shift is shown. The network 10, well known by those skilled in the art, is the resistor capacitor ladder phase shift network consisting of resistors 25, 27, and 29, and capacitors 24, 26, and 28.

Figure 3:
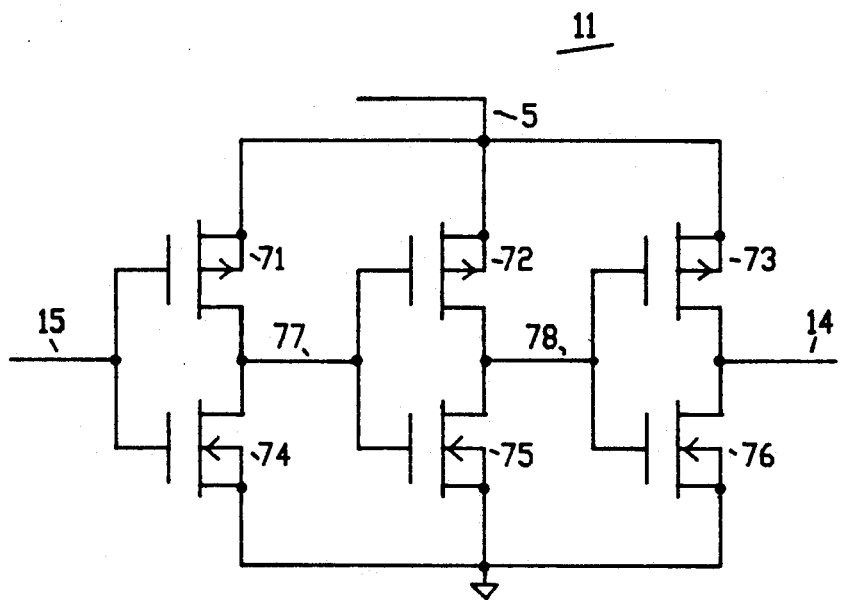
FIG. 3 is a schematic representation of Amplifier 11.

Referring now to FIG. 3 a practical means of implementing amplifier 11 is shown. The amplifier uses CMOS and is well known by those skilled in the art. Transistors 71 through 73 are PMOS and 74 through 76 are NMOS. The PMOS and NMOS transistors exhibit essentially identical, but complemented characteristics. The signal on line 15 is placed on the gates of transistors 71 and 74. The amplified and inverted output signal on line 77 is connected to the next stage's input, the gates of transistor 72 and 75. The amplified and inverted output signal on line 78 is connected to the next stage's input, the gates of transistor 73 and 76. The amplified and inverted output signal of this stage is on line 14. The voltage to power each amplifier stage is supplied by line 5.

Figure 4:
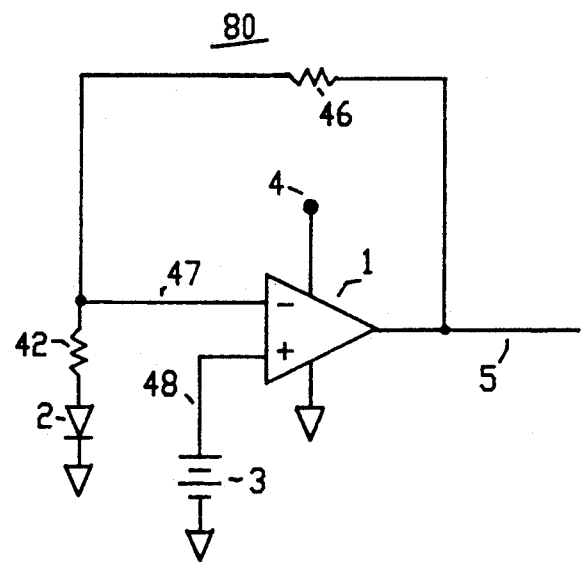
FIG. 4 is a schematic representation of Voltage supply 80.

Referring now to FIG. 4, a practical means of implementing voltage supply 80 is shown. Operational amplifier 1 receives unregulated voltage at terminal 4. Amplifier 1 maintains the voltage level on line 5 at a value that makes the voltage level on line 47 equal to that on line 48. The voltage on line 48 is a fixed value determined by voltage reference 3. The voltage on line 47 is a ratio of the voltage on line 5. The ratio is determined by the value of resistors 42 and 46 and the forward voltage drop of diode 2. The diode 2 performs the function of temperature sensor 2. The forward voltage drop of the diode decreases as it's temperature increases causing the voltage on line 5 to increase. Diode 2 is thermally connected to Amplifier 11 so that they are both essentially at the same temperature. As the temperature of Amplifier 11 increases the voltage of line 5 also increases.

Diode 2 is not needed if resistor 46 is made of temperature sensitive material such as doped silicon. This resistor can be formed on the same substrate as Amplifier 11 transistors to provide good thermal coupling. When resistor 46 is used as the temperature sensor 2, diode 2 is removed from the circuit and the terminal of resistor 42 that was connected to diode 2 now is connected to ground.

Figure 5:
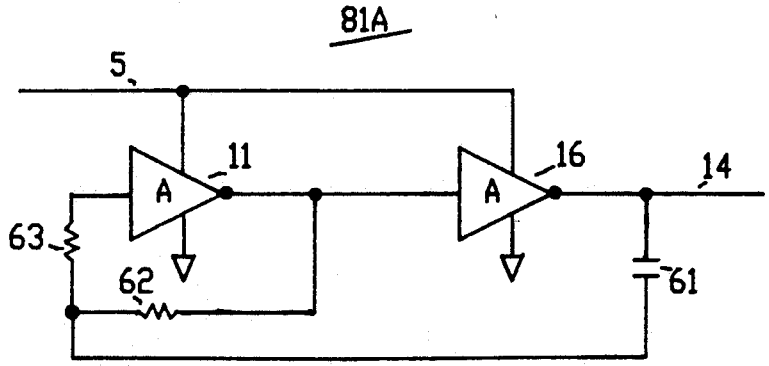
FIG. 5 is a schematic representation of an alternate embodiment of Oscillator 81.

Referring now to FIG. 5, oscillator 81A is shown. Oscillator 81A is one possible alternate embodiment of oscillator 81. Oscillator 81A is configured as a astable multivibrator. The astable multivibrator is well known by those skilled in the art. Two inverting amplifiers, amplifier 11 and 16, are used to provide the necessary gain. Amplifier 16 may be identical to amplifier 11. The oscillator frequency is primarily determined by the time constant of the feedback network consisting of resistor 62 and capacitor 61. The value of resistor 63 is much higher than resistor 62 to prevent the input impedance of amplifier 11 from effecting the time constant of the feedback network.

Although the above description has been directed to preferred embodiments of the invention, it will be understood and appreciated by those skilled in the art that other variations and modifications may be made without departing from the spirit and scope of the invention, and therefore the invention includes the full range of equivalents of the features and aspects set forth in the appended claims.

I claim:

1. A FET oscillator system having an oscillator with an active amplifier element and a feedback network, said an oscillator having oscillator output frequency and receiving a frequency control signal, said oscillator output frequency having first frequency variations induced by temperature variations and second frequency variations induced by variations in said frequency control signal, comprising:

adjusting means for providing said variations in said frequency control signal in accordance with said temperature variations;

said adjusting means having reference voltage means for determining said variations in said frequency control signal in accordance with said temperature variations;

means within said active amplifier element for receiving said variations in said frequency control signal to induce said second frequency variations; and, said second frequency variations compensating said first frequency variations to provide a constant oscillator output frequency.

2. The FET oscillator system of claim 1, wherein said frequency control signal is a voltage level.

3. The FET oscillator system of claim 2, wherein said oscillator comprises a CMOS amplifier.

4. The FET oscillator system of claim 2, wherein said adjusting means comprises a diode.

5. The FET oscillator system of claim 2, wherein said adjusting means comprises a temperature sensitive resistor.

6. The FET oscillator system of claim 2, further comprising frequency control signal means for adjusting said frequency control signal in accordance with a further frequency control input signal.

7. The FET oscillator system of claim 2, wherein said adjusting means comprises frequency control signal feedback means for applying said frequency control signal to said adjusting means and feedback control signal providing means for determining said frequency control signal in accordance with said feedback control signal.

8. The FET oscillator system having an oscillator with an active amplifier element and a feedback network, said an oscillator having oscillator output frequency and receiving a frequency control signal, said oscillator output frequency having first frequency variations induced by temperature variations and second frequency variations induced by variations in said frequency control signal, comprising:

adjusting means for providing said variations in said frequency control signal in accordance with said temperature variations:

said adjusting means having frequency control signal feedback means for applying said frequency control signal to said adjusting means and feedback control signal providing means for determining said frequency control signal in accordance with said feedback control signal;

means within said active amplifier element for receiving said variations in said frequency control signal to induce said second frequency variations; and, said second frequency variations compensating said first frequency variations to provide a constant oscillator output frequency.

9. The FET oscillator system of claim 8, wherein said adjusting means comprises a temperature sensitive device.

* * * * *